(12) United States Patent
Kang

(10) Patent No.: US 12,289,110 B2
(45) Date of Patent: Apr. 29, 2025

(54) PHASE CORRECTION CIRCUIT, AND CLOCK BUFFER AND SEMICONDUCTOR APPARATUS INCLUDING THE SAME

(71) Applicant: SK hynix Inc., Icheon-si (KR)

(72) Inventor: Ji Hyo Kang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 18/501,517

(22) Filed: Nov. 3, 2023

(65) Prior Publication Data

US 2024/0063781 A1    Feb. 22, 2024

Related U.S. Application Data

(62) Division of application No. 17/585,241, filed on Jan. 26, 2022, now Pat. No. 11,824,544.

(30) Foreign Application Priority Data

Aug. 17, 2021 (KR) .......................... 10-2021-0108093

(51) Int. Cl.
| H03K 5/15 | (2006.01) |
| G11C 7/22 | (2006.01) |
| G11C 11/4076 | (2006.01) |
| H03K 5/135 | (2006.01) |

(52) U.S. Cl.
CPC ......... *H03K 5/15013* (2013.01); *G11C 7/222* (2013.01); *G11C 11/4076* (2013.01); *H03K 5/135* (2013.01)

(58) Field of Classification Search
None
See application file for complete search history.

(56) References Cited

U.S. PATENT DOCUMENTS

| 8,400,196 | B2 | 3/2013 | Kim |
| 9,667,252 | B1 | 5/2017 | Lee et al. |
| 10,536,259 | B1 | 1/2020 | Kenyon |
| 11,256,286 | B1 | 2/2022 | Ayyanar et al. |
| 2009/0224811 | A1* | 9/2009 | Camara ..................... G06F 1/04 |
| | | | 327/276 |

* cited by examiner

*Primary Examiner* — Cassandra F Cox
(74) *Attorney, Agent, or Firm* — WILLIAM PARK & ASSOCIATES LTD.

(57) ABSTRACT

A phase correction circuit includes a plurality of signal paths configured to transmit multi-phase signals. The phase correction circuit further includes a loop circuit coupled to the plurality of signal paths, the loop circuit configured to correct phase skew among the multi-phase signals by averaging the phases of two signals which are obtained by synthesizing a signal of each of the signal paths with another signal of a signal path different from the corresponding signal path.

9 Claims, 9 Drawing Sheets if, N=3

| FINF | Operation Speed | Pre-Code | Drivability Control Code ||
| | | | STCODE<0:3> | STCODEB<0:3> |
|---|---|---|---|---|
| 00 | Low Speed | PRECODE 0 | 0000 | 1111 |
| 01 | High Speed-1 | PRECODE 1 | 1000 | 0111 |
| 10 | High Speed-2 | PRECODE 2 | 1100 | 0011 |
| 11 | High Speed-3 | PRECODE 3 | 1110 | 0001 |

PHASE CORRECTION CIRCUIT, AND CLOCK BUFFER AND SEMICONDUCTOR APPARATUS INCLUDING THE SAME

CROSS-REFERENCES TO RELATED APPLICATION

The present application is a divisional application of U.S. patent application Ser. No. 17/585,241, filed on Jan. 26, 2022, and claims priority under 35 U.S.C. § 119(a) to Korean application number 10-2021-0108093, filed on Aug. 17, 2021, in the Korean Intellectual Property Office, which is incorporated herein by reference in its entirety.

BACKGROUND

1. Technical Field

Various embodiments generally relate to a semiconductor circuit, and particularly, to a phase correction circuit, and a clock buffer and a semiconductor apparatus including the same.

2. Related Art

A semiconductor circuit, e.g. semiconductor memory, uses a clock signal as a reference signal for a read or write operation. The semiconductor memory uses multi-phase clock signals, e.g. 4-phase clock signals. A clock buffer of the semiconductor memory receives a clock signal provided from outside the semiconductor memory, and generates multi-phase clock signals. A skew may be present in the multi-phase clock signals themselves, or contained in the multi-phase clock signals due to differences among signal transmission paths for transmitting the respective multi-phase clock signals. When the multi-phase clock signals contain a skew, the operation performance of a circuit for processing data is degraded. As a result, the reliability of data is degraded.

SUMMARY

Various embodiments are directed to a phase correction circuit capable of automatically correcting phase skew among multi-phase signals, and a clock buffer and a semiconductor apparatus including the same.

In an embodiment, a phase correction circuit may include: a plurality of signal paths configured to transmit multi-phase signals; and a loop circuit coupled to the plurality of signal paths, the loop circuit configured to correct phase skew among the multi-phase signals by averaging the phases of two signals which are obtained by synthesizing a signal of each of the signal paths with another signal of a signal path different from the corresponding signal path.

The loop circuit may be disabled when an operation frequency is less than a preset value, and have drivability that is varied according to the value of the operation frequency when the operation frequency is equal to or greater than the preset value.

The plurality of signal paths may include a first signal path, a second signal path, a third signal path, and a fourth signal path. The loop circuit may include: a first signal transfer unit configured to invert a signal of a first node of the first signal path, and transfer the inverted signal to a second node of the third signal path; a first programmable buffer configured to buffer a signal of a second node of the first signal path, and transfer the buffered signal to a first node of the second signal path; a second signal transfer unit configured to invert a signal of the first node of the second signal path, and transfer the inverted signal to a second node of the fourth signal path; a second programmable buffer configured to buffer a signal of a second node of the second signal path, and transfer the buffered signal to a first node of the third signal path; a third signal transfer unit configured to invert a signal of the first node of the third signal path, and transfer the inverted signal to the second node of the first signal path; a third programmable buffer configured to buffer a signal of the second node of the third signal path, and transfer the buffered signal to a first node of the fourth signal path; a fourth signal transfer unit configured to invert a signal of the first node of the fourth signal path, and transfer the inverted signal to the second node of the second signal path; and a fourth programmable buffer configured to buffer a signal of the second node of the fourth signal path, and transfer the buffered signal to the first node of the first signal path.

In an embodiment, a phase correction circuit may include: a plurality of signal paths configured to transmit multi-phase signals; a first correction loop configured to synthesize two adjacent signals based on the plurality of signal paths among the multi-phase signals; and a second correction loop configured to synthesize complementary signals among the multi-phase signals.

In an embodiment, a clock buffer may include: a phase separator configured to receive an external clock signal and generate multi-phase clock signals; and a phase correction circuit coupled to a plurality of signal paths for transmitting the multi-phase clock signals, the phase correction circuit configured to correct phase skew among the multi-phase clock signals by averaging the phases of two signals which are obtained by synthesizing a signal of each of the signal paths with another signal of a signal path different from the corresponding signal path.

In an embodiment, a semiconductor apparatus may include: a memory area; a data output circuit configured to output data, outputted from the memory area, to outside the semiconductor apparatus according to a phase-corrected clock signal; and a clock buffer configured to receive an external clock signal, generate multi-phase clock signals, and generate the phase-corrected clock signal by performing a phase averaging operation on a signal of each of a plurality of signal paths for transmitting the multi-phase clock signals and a signal of another signal path.

In an embodiment, a phase correction circuit may include: a loop circuit coupled to a plurality of signal paths configured to transmit multi-phase clock signals, and configured to perform at least one of an operation of synthesizing two adjacent signals based on the plurality of signal paths and an operation of synthesizing complementary signals among the multi-phase clock signals; a plurality of programmable buffers coupled to the plurality of signal paths, the plurality of programmable buffers configured to operate in response to a control code; and a code control circuit configured to generate the control code in response to operation frequency information. The phase correction circuit may correct phase skew among the multi-phase clock signals by controlling the drivabilities of the programmable buffers and the phase averaging of two signals, synthesized by the loop circuit, according to the control code.

The programmable buffers may be disabled according to the control code when an operation frequency defined in the operation frequency information is less than a preset value, and each of the programmable buffers has drivability that is varied according to the value of the operation frequency when the operation frequency is equal to or greater than the preset value.

DETAILED DESCRIPTION

Hereafter, embodiments will be described in more detail with reference to the accompanying drawings.

Figure 1:
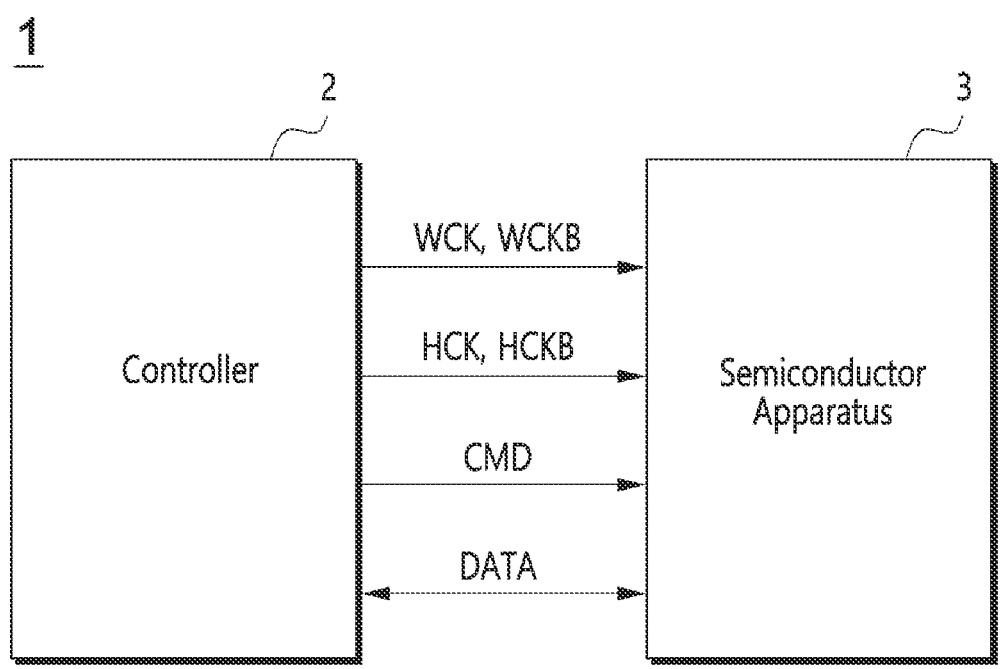
FIG. 1 is a diagram illustrating a configuration of a semiconductor system in accordance with an embodiment.

FIG. 1 is a diagram illustrating a configuration of a semiconductor system 1 in accordance with an embodiment.

Referring to FIG. 1, the semiconductor system 1 may include a controller 2 and a semiconductor apparatus 3.

The controller 2 may be a GPU (Graphics Processing Unit) or CPU (Central Processing Unit). The controller 2 may provide the semiconductor apparatus 3 with external clock signals, e.g. a data clock signal WCK/WCKB, a system clock signal HCK/HCKB, and a command signal CMD. The data clock signal WCK/WCKB may have a period or/and frequency different from that of the system clock signal HCK/HCKB. When writing data DATA, the controller 2 may provide the data clock signal WCK/WCKB to the semiconductor apparatus 3. The controller 2 may receive the data DATA outputted from the semiconductor apparatus 3 according to a read command.

The semiconductor apparatus 3 may use multi-phase clock signals as a reference signal for a read or write operation. The semiconductor apparatus 3 may generate the multi-phase clock signals by using an external clock signal, e.g. the data clock signal WCK/WCKB. The semiconductor apparatus 3 may be a volatile memory apparatus, a nonvolatile memory apparatus, or a memory apparatus in which volatile and nonvolatile memories are mixed.

Figure 2:
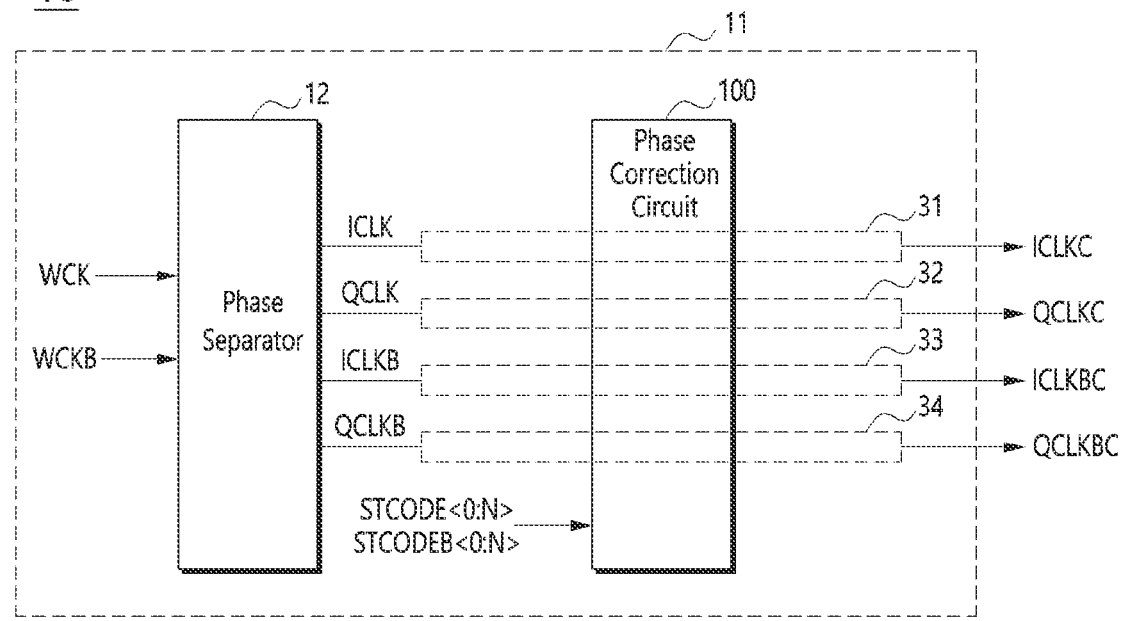
FIG. 2 is a diagram illustrating a configuration of a semiconductor apparatus in accordance with an embodiment.
Figure 2:
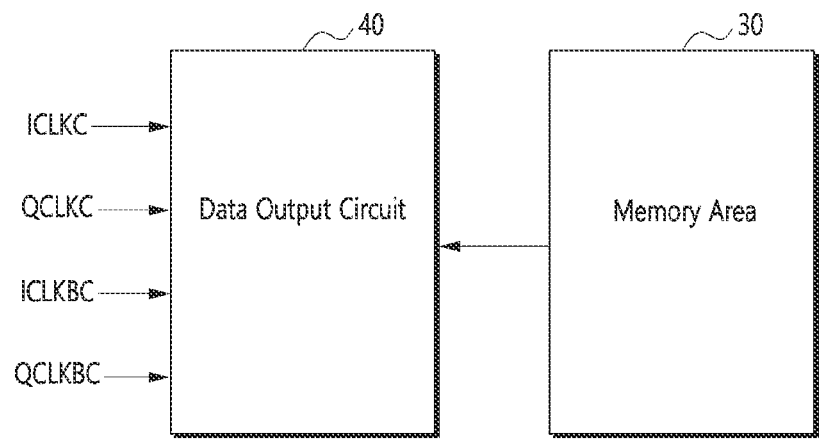
Figure 2:
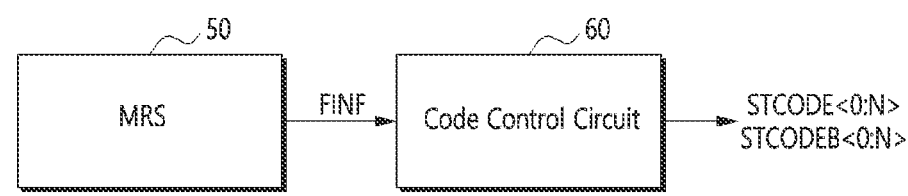

FIG. 2 is a diagram illustrating a configuration of a semiconductor apparatus 10 in accordance with an embodiment.

Referring to FIG. 2, the semiconductor apparatus 10 may include a clock buffer 11, a memory area 30, and a data output circuit 40. The semiconductor apparatus 10 may further include a MRS (mode register set) 50 and a code control circuit 60.

The clock buffer 11 may receive the data clock signals WCK and WCKB, and generate multi-phase clock signals ICLK, QCLK, ICLKB, and QCLKB. The clock buffer 11 may be configured to perform a phase correction operation of generating phase-corrected clock signals ICLKC, QCLKC, ICLKBC, and QCLKBC by compensating for skew among the multi-phase clock signals ICLK, QCLK, ICLKB, and QCLKB by synthesizing a signal of at least one path among a plurality of signal paths 31 to 34 with another signal path. The clock buffer 11 may be configured to determine whether to perform the phase correction operation according to the operation frequency of the semiconductor apparatus 10. The clock buffer 11 may be configured to change drivability during the phase correction operation, according to the operation frequency of the semiconductor apparatus 10.

The clock buffer 11 may include a phase separator 12, a phase correction circuit 100, and the plurality of signal paths 31 to 34.

The phase separator 12 may receive the data clock signals WCK and WCKB, and generate the multi-phase clock signals ICLK, QCLK, ICLKB, and QCLKB. The phase separator 12 may separate the phases of the data clock signals WCK and WCKB and simultaneously divide the phases of the data clock signals WCK and WCKB, such that the multi-phase clock signals ICLK, QCLK, ICLKB, and QCLKB each have a frequency divided by 2 or 4, compared to those of the external clock signals WCK and WCKB.

Figure 6:
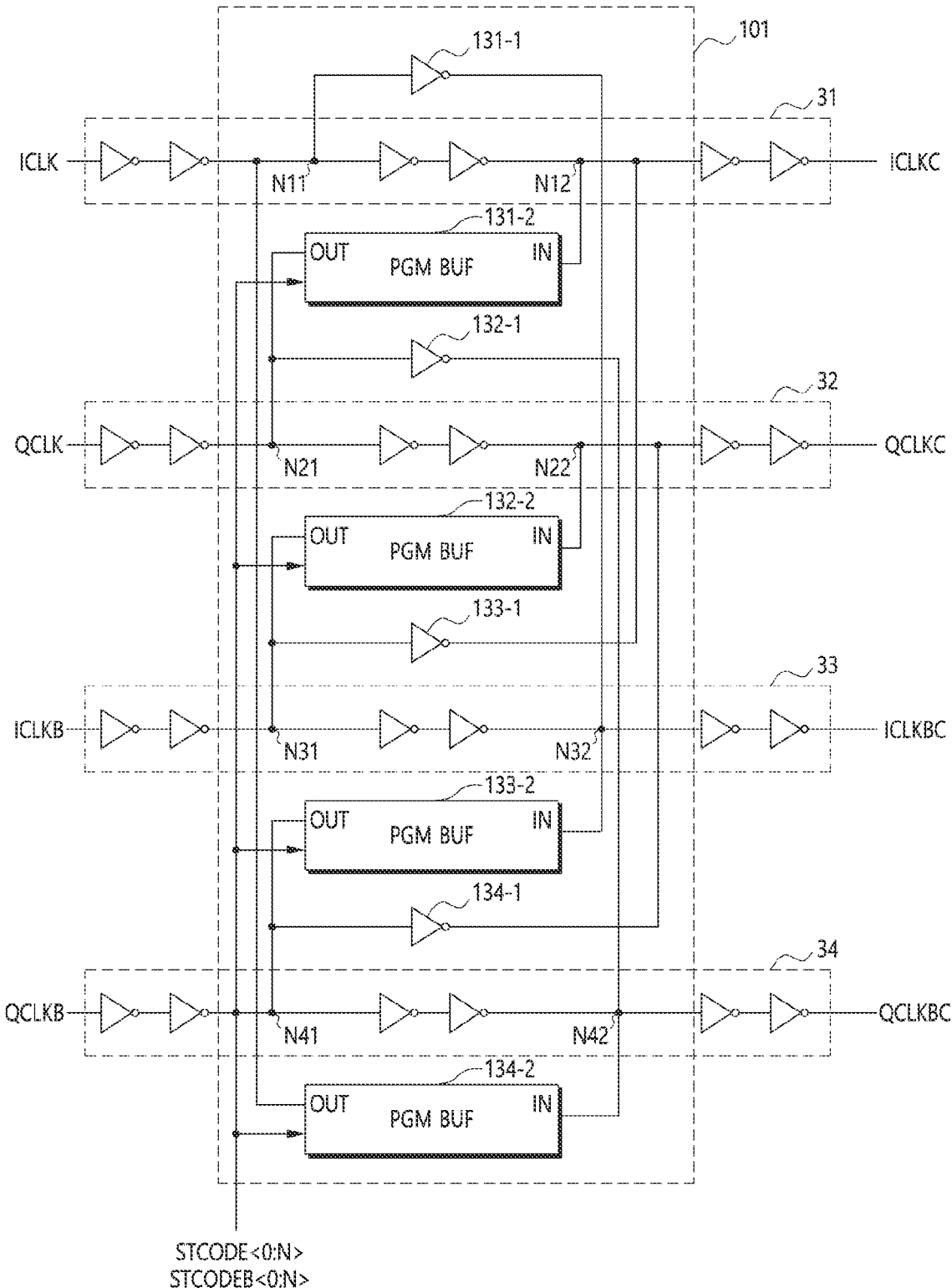
FIG. 6 is a diagram illustrating a configuration of a phase correction circuit of FIG. 2.

The phase correction circuit 100, shown in greater detail in FIG. 6, may include a loop circuit 101, a plurality of programmable buffers, and a code control circuit. The loop circuit 101 may be coupled to the plurality of signal paths 31 to 34 configured to transmit the multi-phase clock signals ICLK, QCLK, ICLKB, and QCLKB, respectively, and configured to perform one or more of an operation of synthesizing two adjacent signals on the basis of the plurality of signal paths 31 to 34 and an operation of synthesizing complementary signals among the multi-phase clock signals. The plurality of programmable buffers may be coupled to the plurality of signal paths 31 to 34, and configured to operate in response to drivability control codes STCODE<0:N> and STCODEB<0:N>. The code control circuit may be configured to generate the control codes in response to operation frequency information FINF. The phase correction circuit 100 may be configured to correct the phase skew among the multi-phase clock signals ICLK, QCLK, ICLKB, and QCLKB by controlling the drivabilities of the programmable buffers and the phase averaging of the two signals synthesized by the loop circuit 101, according to the drivability control codes STCODE<0:N> and STCODEB<0:N>.

In the present embodiment, when an operation frequency defined in the operation frequency information FINF is less than a preset value, the programmable buffers may be disabled according to the drivability control codes STCODE<0:N> and STCODEB<0:N>. When the operation frequency is equal to or greater than the preset value, the drivabilities of the programmable buffers may be changed.

The phase correction circuit 100 may include the plurality of signal paths 31 to 34. The phase correction circuit 100 may perform the phase correction operation of compensating for the skew among the multi-phase clock signals ICLK, QCLK, ICLKB, and QCLKB by synthesizing a signal of at least one path of the plurality of signal paths 31 to 34 with another signal path. The phase correction circuit 100 may interrupt the phase correction operation in response to the drivability control codes STCODE<0:N> and STCODEB<0:N>. The drivability control codes STCODE<0:N> and STCODEB<0:N> may each include a plurality of signal bits, and have a complementary relationship with each other. The phase correction circuit 100 may change the drivability of the phase correction operation in response to the drivability control codes STCODE<0:N> and STCODEB<0:N>.

The plurality of signal paths 31 to 34 may delay the multi-phase clock signals ICLK, QCLK, ICLKB, and QCLKB and output the delayed signals. The plurality of signal paths 31 to 34 may transmit the multi-phase clock signals ICLK, QCLK, ICLKB, and QCLKB having passed through the phase correction circuit 100 as the phase-corrected clock signals ICLKC, QCLKC, ICLKBC, and QCLKBC to the data output circuit 40. The plurality of signal paths 31 to 34 may include a first signal path 31, a second signal path 32, a third signal path 33, and a fourth signal path 34. The first signal path 31 may output the phase clock signal ICLK having passed through the phase correction circuit 100 as the phase-corrected clock signal ICLKC. The second signal path 32 may output the phase clock signal QCLK having passed through the phase correction circuit 100 as the phase-corrected clock signal QCLKC. The third signal path 33 may output the phase clock signal ICLKB having passed through the phase correction circuit 100 as the phase-corrected clock signal ICLKBC. The fourth signal path 34 may output the phase clock signal QCLKB having passed through the phase correction circuit 100 as the phase-corrected clock signal QCLKBC.

The memory area 30 may include at least one of volatile memory and nonvolatile memory. Examples of volatile memory include SRAM (Static RAM), DRAM (Dynamic RAM), and SDRAM (Synchronous DRAM), and examples of nonvolatile memory include ROM (Read Only Memory), PROM (Programmable ROM), EEPROM (Electrically Erasable and Programmable ROM), EPROM (Electrically Programmable ROM), flash memory, PRAM (Phase change RAM), MRAM (Magnetic RAM), RRAM (Resistive RAM), and FRAM (Ferroelectric RAM). The memory area 30 may output data stored therein during a read operation of the semiconductor apparatus 10, and store data inputted from outside the semiconductor apparatus 10 during a write operation thereof.

The data output circuit 40 may output the data, outputted from the memory area 30, to outside the semiconductor apparatus 10 according to the phase-corrected clock signals ICLKC, QCLKC, ICLKBC, and QCLKBC.

The MRS 50 may store the operation frequency information FINF of the semiconductor apparatus 10, and output the stored operation frequency information FINF. The operation frequency information FINF may be set at a fabrication step of the semiconductor apparatus 10, or received from an external device, e.g. the controller 2, and stored in the MRS 50.

The code control circuit 60 may generate the drivability control codes STCODE<0:N> and STCODEB<0:N> in response to the operation frequency information FINF. The code control circuit 60 may change the values of the drivability control codes STCODE<0:N> and STCODEB<0:N> according to the value of the operation frequency information FINF.

Figure 3:
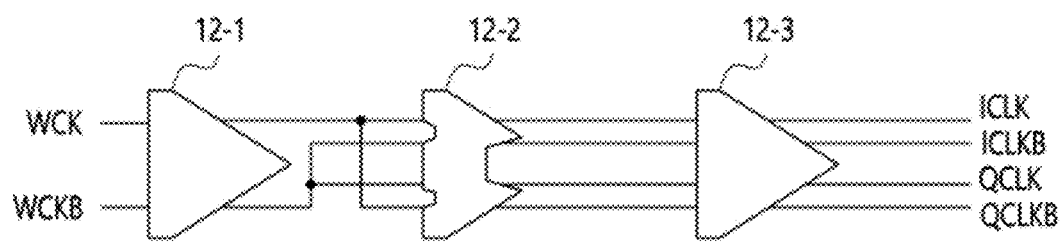
FIG. 3 is a diagram illustrating a configuration of a phase separator of FIG. 2.

FIG. 3 is a diagram illustrating a configuration of the phase separator 12 of FIG. 2.

Referring to FIG. 3, the phase separator 12 may include a first buffer 12-1, a divider 12-2, and a second buffer 12-3. The first buffer 12-1 may buffer the data clock signals WCK and WCKB, and output the buffered signals. The divider 12-2 may separate and divide the phases of the output signals of the first buffer 12-1, and output the divided signals. At this time, the divider 12-2 may divide the phases of the output signals by 2. The second buffer 12-3 may buffer the output signals of the divider 12-2, and output the buffered signals as the multi-phase divided signal ICK/QCK/ICKB/QCKB. The multi-phase clock signals ICLK, QCLK, ICLKB and QCLKB ideally need to have a predetermined phase difference therebetween. However, the multi-phase clock signals ICLK, QCLK, ICLKB and QCLKB may have skew as the phase difference therebetween becomes different from a target value, due to a PVT (Power, Voltage, Temperature) variation.

Figure 4:
FIG. 4 is a diagram illustrating a configuration of a first signal path of FIG. 2.

FIG. 4 is a diagram illustrating a configuration of the first signal path 31 of FIG. 2.

Referring to FIG. 4, the first signal path 31 may include a plurality of inverters 31-1 to 31-N. Although it will be described below, the phase correction circuit 100 may be coupled between an output terminal of any one of the inverters 31-1 to 31-N and an input terminal of another of the inverters 31-1 to 31-N.

Figure 5:
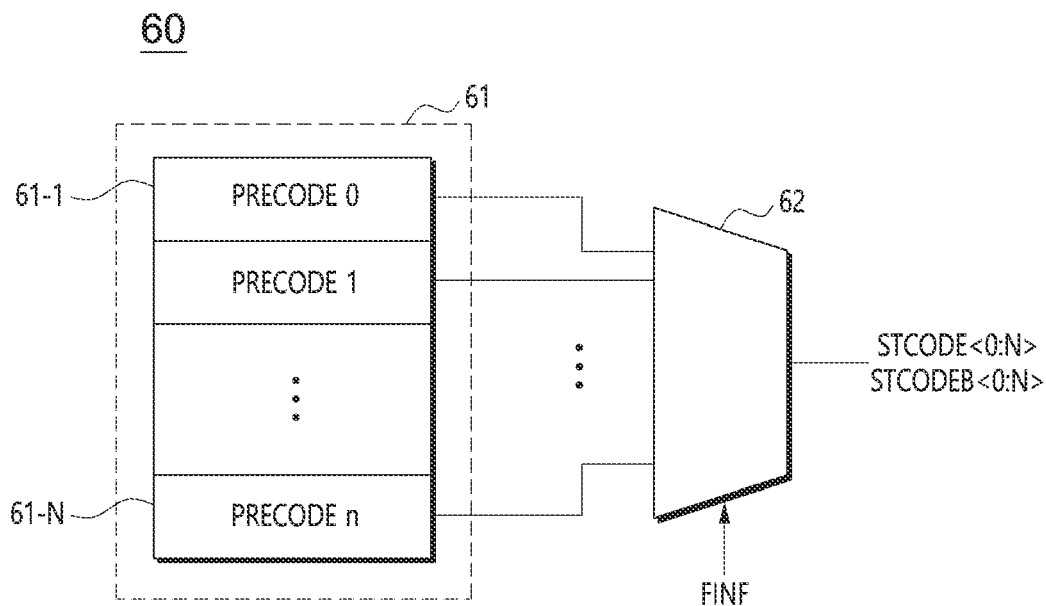
FIG. 5 is a diagram illustrating a configuration of a code control circuit of FIG. 2.

FIG. 5 is a diagram illustrating a configuration of the code control circuit 60 of FIG. 2.

Referring to FIG. 5, the code control circuit 60 may select one of pre-codes PRECODE0 to PRECODEn according to the operation frequency information FINF, and output the selected pre-code as the drivability control codes STCODE<0:N> and STCODEB<0:N>. The pre-codes PRECODE0 to PRECODEn may each include signal bits corresponding to the drivability control codes STCODE<0:N> and STCODEB<0:N>. The values of the pre-codes PRECODE0 to PRECODEn may be set to different values. The code control circuit 60 may include a code storage circuit 61 and a multiplexer 62.

The code storage circuit 61 may include storage circuits for storing the pre-codes PRECODE0 to PRECODEn, e.g. a plurality of registers 61-1 to 61-N. The pre-codes PRECODE0 to PRECODEn may be stored in the plurality of registers 61-1 to 61-N, respectively.

The multiplexer 62 may select the pre-code stored in any one of the plurality of registers 61-1 to 61-N according to the operation frequency information FINF, and output the selected pre-code as the drivability control codes STCODE<0:N> and STCODEB<0:N>.

The operation frequency information FINF may define the operation frequency of the semiconductor apparatus 10, i.e. the operation speed. For example, when the frequency range in which the semiconductor apparatus 10 can operate is divided into four sections A, B, C, and D, the section 'A' may be defined as 'low speed', the section 'B' may be defined as 'high speed-1', the section 'C' may be defined as 'high speed-2', and the section 'D' may be defined as 'high speed-3'. Because the operation speed can be divided into four steps, the operation frequency information FINF may be configured as two bits to define the operation speed. For the low speed, the high speed-1, the high speed-2, and the high speed-3, the values of the operation frequency information FINF may be set to '00', '01', '10', and '11', respectively. At this time, when it is assumed that N is 3 (N=3), a first pre-code PRECODE0 may have a value of '0000' as a value corresponding to the drivability control code STCODE<0:3> and a value of '1111' as a value corresponding to the drivability control code STCODEB<0:3>. A second pre-code PRECODE1 may have a value of '1000' as a value corresponding to the drivability control code STCODE<0:3> and a value of '0111' as a value corresponding to the drivability control code STCODEB<0:

3>. A third pre-code PRECODE2 may have a value of '1100' as a value corresponding to the drivability control code STCODE<0:3> and a value of '0011' as a value corresponding to the drivability control code STCODEB<0:3>. A fourth pre-code PRECODE3 may have a value of '1110' as a value corresponding to the drivability control code STCODE<0:3> and a value of '0001' as a value corresponding to the drivability control code STCODEB<0:3>.

When the value of the operation frequency information FINF is '00', the multiplexer 62 may output the first pre-code PRECODE0 as the drivability control codes STCODE<0:3> and STCODEB<0:3>. When the value of the operation frequency information FINF is '01', the multiplexer 62 may output the second pre-code PRECODE1 as the drivability control codes STCODE<0:3> and STCODEB<0:3>. When the value of the operation frequency information FINF is '10', the multiplexer 62 may output the third pre-code PRECODE2 as the drivability control codes STCODE<0:3> and STCODEB<0:3>. When the value of the operation frequency information FINF is '11', the multiplexer 62 may output the fourth pre-code PRECODE3 as the drivability control codes STCODE<0:3> and STCODEB<0:3>.

FIG. 6 is a diagram illustrating a configuration of the phase correction circuit 100 of FIG. 2.

Referring to FIG. 6, the phase correction circuit 100 may include the first to fourth signal paths 31 to 34 and the loop circuit 101.

The loop circuit 101 may be configured to perform phase averaging by synthesizing signals of the first to fourth signal paths 31 to 34 with different paths, respectively, thereby compensating for skew among the multi-phase clock signals ICLK, QCLK, ICLKB, and QCLKB. The loop circuit 101 may include a first correction loop and a second correction loop, which will be described below with reference to FIGS. 8 and 9. The loop circuit 101 may include a plurality of signal transfer units 131-1, 132-1, 133-1, and 134-1 and a plurality of programmable buffers 131-2, 132-2, 133-2, and 134-2. The plurality of signal transfer units 131-1, 132-1, 133-1, and 134-1 may be each configured as an inverter. The drivabilities of the plurality of programmable buffers 131-2, 132-2, 133-2, and 134-2 may be changed according to the drivability control codes STCODE<0:N> and STCODEB<0:N>. The first signal transfer unit 131-1 may invert a signal of a node N11 of the first signal path 31, and transfer the inverted signal to a node N32 of the third signal path 33. The first programmable buffer 131-2 may buffer a signal of a node N12 of the first signal path 31, and transfer the buffered signal to a node N21 of the second signal path 32. The second signal transfer unit 132-1 may invert a signal of the node N21 of the second signal path 32, and transfer the inverted signal to a node N42 of the fourth signal path 34. The second programmable buffer 132-2 may buffer a signal of a node N22 of the second signal path 32, and transfer the buffered signal to a node N31 of the third signal path 33. The third signal transfer unit 133-1 may invert a signal of the node N31 of the third signal path 33, and transfer the inverted signal to the node N12 of the first signal path 31. The third programmable buffer 133-2 may buffer a signal of the node N32 of the third signal path 33, and transfer the buffered signal to a node N41 of the fourth signal path 34. The fourth signal transfer unit 134-1 may invert a signal of the node N41 of the fourth signal path 34, and transfer the inverted signal to the node N22 of the second signal path 32. The fourth programmable buffer 134-2 may buffer a signal of the node N42 of the fourth signal path 34, and transfer the buffered signal to the node N11 of the first signal path 31.

Figure 7:
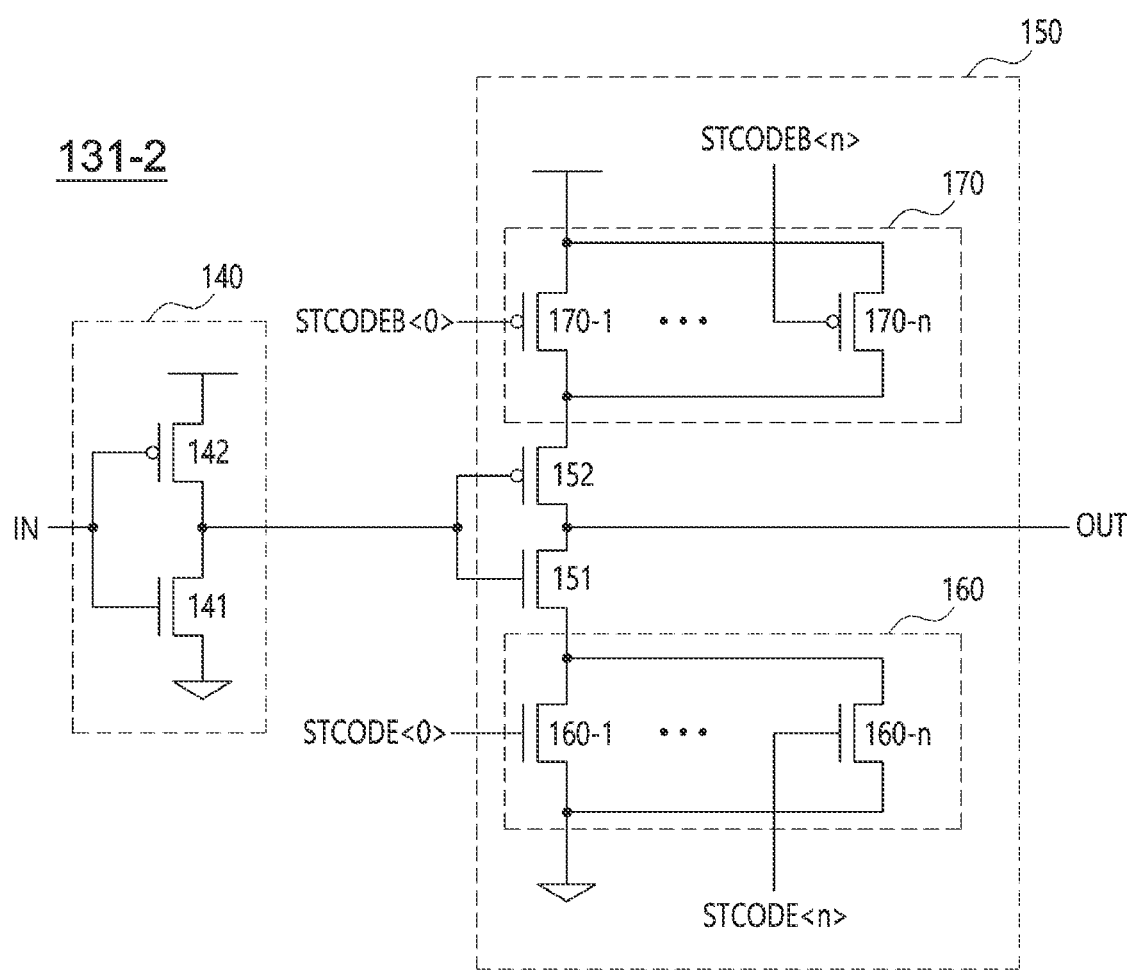
FIG. 7 is a diagram illustrating a configuration of a first programmable buffer of FIG. 6.

FIG. 7 is a diagram illustrating a configuration of the first programmable buffer 131-2 of FIG. 6.

Referring to FIG. 7, the first programmable buffer 131-2 may include a basic driving unit 140 and a variable driving unit 150.

The basic driving unit 140 may drive and output an input signal IN. The basic driving unit 140 may include a first transistor 141 and a second transistor 142. The first transistor 141 may drive an output node to a ground terminal level according to the level of the input signal IN. The second transistor 142 may drive the output node to a power supply terminal level according to the level of the input signal IN.

The variable driving unit 150 may drive the output signal of the basic driving unit 140 with the drivability which is varied according to the drivability control codes STCODE<0:N> and STCODEB<0:N>, and output the driven signal. The variable driving unit 150 may include a first transistor 151, a second transistor 152, a first drivability adjusting circuit 160, and a second drivability adjusting circuit 170. The first drivability adjusting circuit 160 may have a resistance value that is varied according to the drivability control code STCODE<0:N>. The first drivability adjusting circuit 160 may include a plurality of transistors 160-1 to 160-N which are commonly coupled to a ground terminal and configured to receive the respective bits of the drivability control code STCODE<0:N> through gate terminals thereof. The first transistor 151 may drive an output node to the ground terminal level according to the output signal of the basic driving unit 140, and have a driving time that is varied by the first drivability adjusting circuit 160. The second drivability adjusting circuit 170 may include a plurality of transistors 170-1 to 170-N which are commonly coupled to a power supply terminal and configured to receive the respective bits of the drivability control code STCODEB<0:N> through gate terminals thereof. The second transistor 152 may drive the output node to the power supply terminal level according to the output signal of the basic driving unit 140, and have a driving time that is varied by the second drivability adjusting circuit 170.

As described with reference to FIG. 5, when the operation speed of the semiconductor apparatus 10 is set to the low speed, the first pre-code PRECODE0 may be provided as the drivability control codes STCODE<0:N> and STCODEB<0:N> to the first to fourth programmable buffers 131-2, 132-2, 133-2, and 134-2 in common. Because the drivability control code STCODE<0:3> is '0000' and the drivability control code STCODEB<0:3> is '1111', all the transistors of the first and second drivability adjusting circuits 160 and 170 may be turned off to stop the operations of the first to fourth programmable buffers 131-2, 132-2, 133-2 and 134-2. Because the operations of the first to fourth programmable buffers 131-2, 132-2, 133-2, and 134-2 are stopped, the operations of the first and second correction loops of the loop circuit 101 may also be stopped. When the operation speed of the semiconductor apparatus 10 is the low speed, the skew among the multi-phase clock signals ICLK, QCLK, ICLKB, and QCLKB may be minimized. Thus, the operation of the loop circuit 101 may be stopped to reduce the current consumption.

When the operation speed of the semiconductor apparatus 10 is set to the high speed-1, the second pre-code PRECODE1 may be provided as the drivability control codes STCODE<0:3> and STCODEB<0:3> to the first to fourth programmable buffers 131-2, 132-2, 133-2, and 134-2 in common. The drivability control code STCODE<0:3> has a code value of '1000' which has increased in comparison to the first pre-code PRECODE0, and the drivability control code STCODEB<0:3> has a code value of '0111' which has decreased in comparison to the first pre-code PRECODE0. Therefore, the first to fourth programmable buffers 131-2, 132-2, 133-2, and 134-2 may operate and generate an output signal OUT by delaying the input signal IN by a first time and driving the delayed signal. Through the operations of the first to fourth programmable buffers 131-2, 132-2, 133-2, and 134-2, the first and second correction loops of the loop circuit 101 may be operated to correct the skew among the multi-phase clock signals ICLK, QCLK, ICLKB, and QCLKB.

When the operation speed of the semiconductor apparatus 10 is set to the high speed-2, the third pre-code PRECODE2 may be provided as the drivability control codes STCODE<0:3> and STCODEB<0:3> to the first to fourth programmable buffers 131-2, 132-2, 133-2, and 134-2 in common. The drivability control code STCODE<0:3> has a code value of '1100' which has increased in comparison to the second pre-code PRECODE1, and the drivability control code STCODEB<0:3> has a code value of '0011' which has decreased in comparison to the second pre-code PRECODE1. Therefore, the first to fourth programmable buffers 131-2, 132-2, 133-2, and 134-2 may operate and generate the output signal OUT by delaying the input signal IN by a second time and driving the delayed signal. The second time may be shorter than the first time. Through the operations of the first to fourth programmable buffers 131-2, 132-2, 133-2, and 134-2, the first and second correction loops of the loop circuit 101 may be operated to correct the skew among the multi-phase clock signals ICLK, QCLK, ICLKB, and QCLKB.

When the operation speed of the semiconductor apparatus 10 is set to the high speed-3, the fourth pre-code PRECODE3 may be provided as the drivability control codes STCODE<0:3> and STCODEB<0:3> to the first to fourth programmable buffers 131-2, 132-2, 133-2, and 134-2 in common. The drivability control code STCODE<0:3> has a code value of '1110' which has increased in comparison to the third pre-code PRECODE2, and the drivability control code STCODEB<0:3> has a code value of '0001' which has decreased in comparison to the third pre-code PRECODE2. Therefore, the first to fourth programmable buffers 131-2, 132-2, 133-2, and 134-2 may operate and generate the output signal OUT by delaying the input signal IN by a third time and driving the delayed signal. The third time may be shorter than the second time. Through the operations of the first to fourth programmable buffers 131-2, 132-2, 133-2, and 134-2, the first and second correction loops of the loop circuit 101 may be operated to correct the skew among the multi-phase clock signals ICLK, QCLK, ICLKB, and QCLKB.

When the operation speed of the semiconductor apparatus 10 is set to the low speed, the first to fourth programmable buffers 131-2, 132-2, 133-2, and 134-2 of the loop circuit 101 may be disabled. As the first to fourth programmable buffers 131-2, 132-2, 133-2, and 134-2 are disabled, the operation of the first correction loop may be stopped, and the operation of the second correction loop may be partially stopped.

When the operation speed of the semiconductor apparatus 10 is set to the high speed-1, the high speed-2, or the high speed-3, the first to fourth programmable buffers 131-2, 132-2, 133-2, and 134-2 may be enabled, and the first and second correction loops may be operated to correct the skew among the multi-phase clock signals ICLK, QCLK, ICLKB, and QCLKB. The semiconductor apparatus 10 may reduce the signal processing delay times of the first to fourth programmable buffers 131-2, 132-2, 133-2, and 134-2 according to the drivability control codes STCODE<0:3> and STCODEB<0:3>, such that the signal processing delay times are suitable for the operation speed, i.e. the high speed-1, the high speed-2 or the high speed-3.

Hereafter, the operation of the loop circuit 101 will be described with reference to FIGS. 8 and 9. The loop circuit 101 of the semiconductor apparatus 10 in accordance with the present embodiment may include a plurality of correction loops, and skew correction operations by the plurality of correction loops may be performed at the same time.

Figure 8:
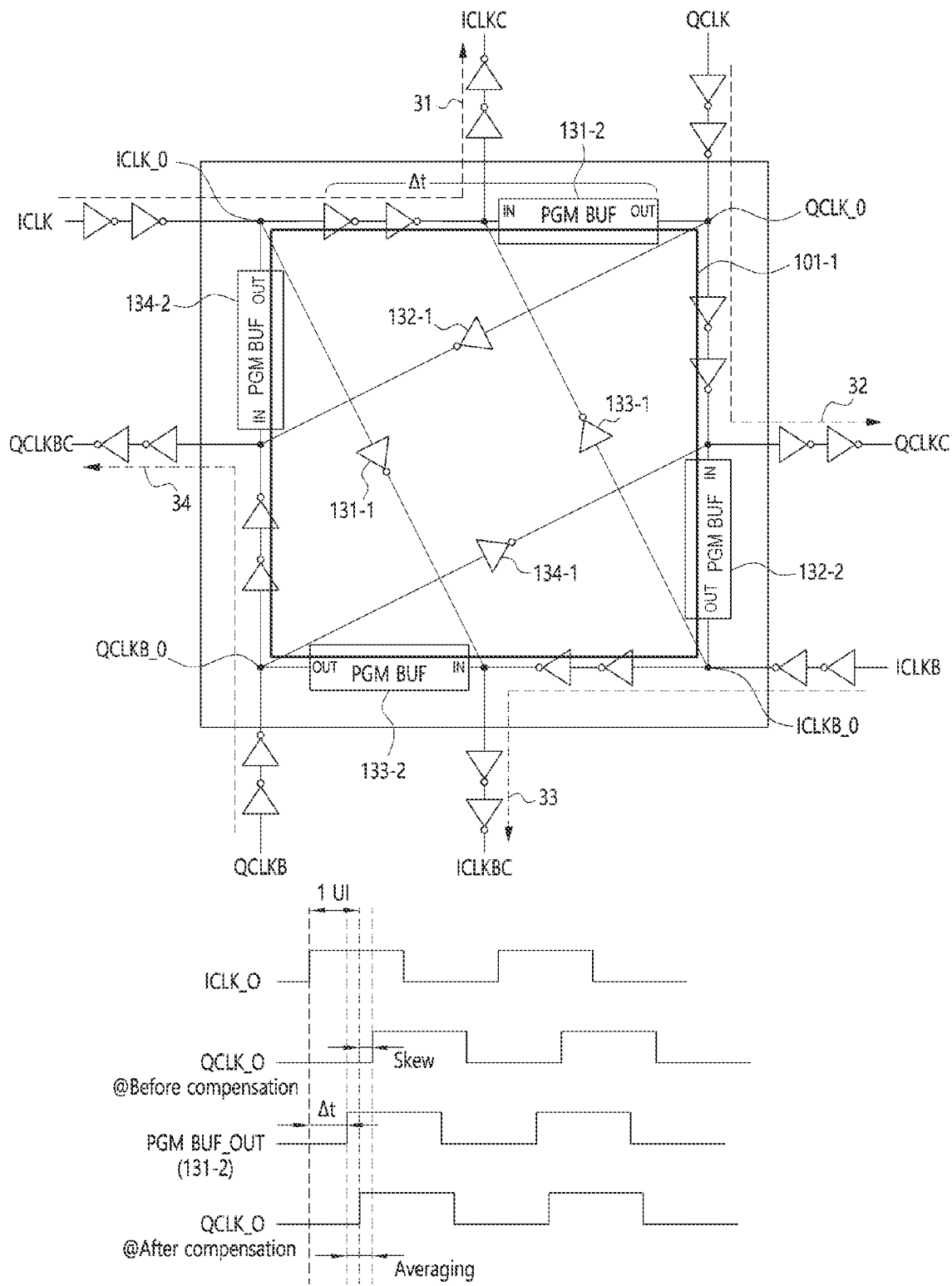
FIG. 8 is a diagram illustrating a configuration of a first correction loop of the phase correction circuit of FIG. 6 in accordance with an embodiment.

FIG. 8 is a diagram illustrating a configuration of a first correction loop 101-1 of the phase correction circuit in accordance with the present embodiment.

Referring to FIG. 8, the first correction loop 101-1 may be configured to perform skew correction by averaging the phases of two adjacent signals on the basis of the first to fourth signal paths 31 to 34, among the multi-phase clock signals ICLK, QCLK, ICLKB, and QCLKB.

The first correction loop 101-1 may be configured as the first to fourth programmable buffers 131-2, 132-2, 133-2, and 134-2. The first programmable buffer 131-2 may mix a signal of the first signal path 31 with the second signal path 32, the second programmable buffer 132-2 may mix a signal of the second signal path 32 with the third signal path 33, the third programmable buffer 133-2 may mix a signal of the third signal path 33 with the fourth signal path 34, and the fourth programmable buffer 134-2 may mix a signal of the fourth signal path 34 with the first signal path 31. The loop configured as the first to fourth programmable buffers 131-2, 132-2, 133-2, and 134-2 may be repeatedly operated to average the phases of the multi-phase clock signals ICLK, QCLK, ICLKB, and QCLKB, thereby correcting a phase skew of a signal in which the phase skew occurred among the multi-phase clock signals ICLK, QCLK, ICLKB, and QCLKB.

Hereafter, under the assumption that a phase skew occurred in a signal QCLK_O of the second signal path 32, the phase skew correction operation of the signal QCLK_O will be described. After the delay time of the first signal path 31 and a time Δt by driving delay of the first programmable buffer 131-2, a signal PGM BUF_OUT may be generated. As the signal PGM BUF_OUT is mixed with the node of the signal QCLK_O, the phase of the signal QCLK_O may be corrected to a phase corresponding to the average of the phases of the signal PGM BUF_OUT and the signal QCLK_O. FIG. 8 only illustrates an example of the phase skew correction process for the clock signals ICLK and QCLK among the multi-phase clock signals ICLK, QCLK, ICLKB, and QCLKB. The phase skew correction processes for the clock signals QCLK and ICLKB, the clock signals ICLKB and QCLKB, and the clock signals QCLKB and ICLK may also be performed in the same manner.

Figure 9:
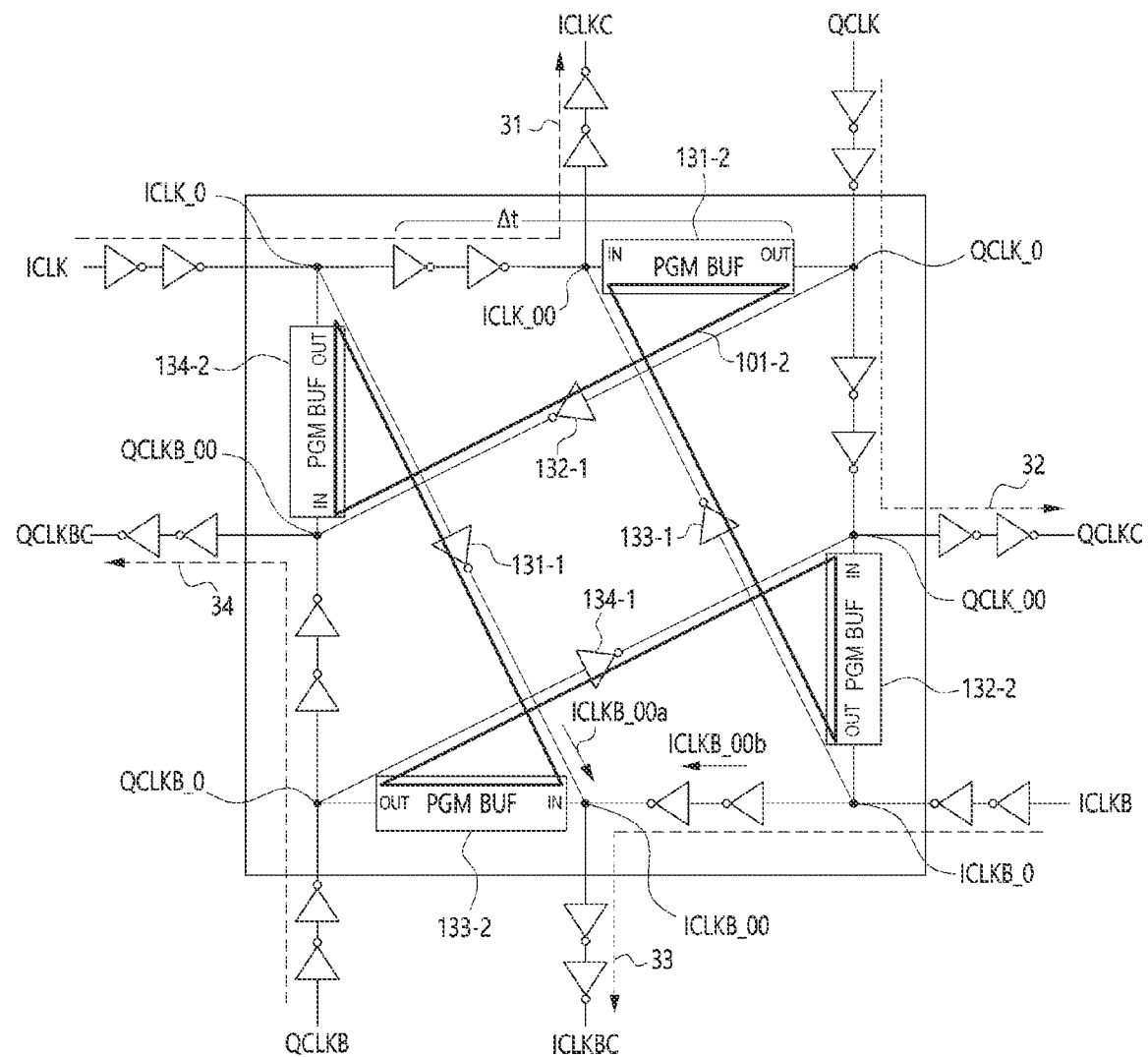
FIG. 9 is a diagram illustrating a configuration of a second correction loop of the phase correction circuit of FIG. 6 in accordance with an embodiment.
Figure 9:
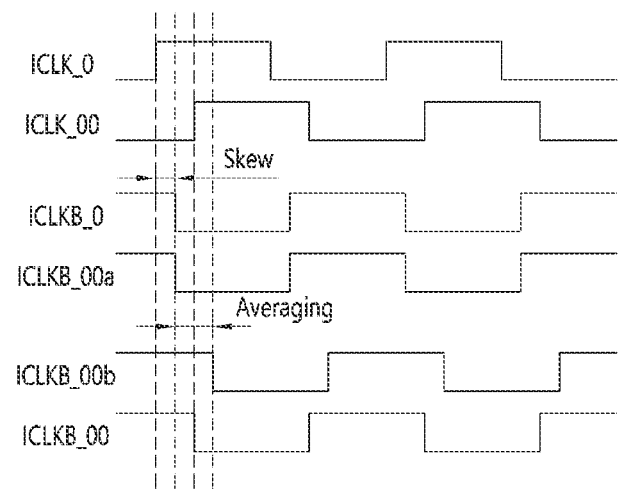

FIG. 9 is a diagram illustrating a configuration of a second correction loop 101-2 of the phase correction circuit in accordance with an embodiment.

Referring to FIG. 9, the second correction loop 101-2 may be configured to perform skew correction by averaging the phases of complementary signals among the multi-phase clock signals ICLK, QCLK, ICLKB, and QCLKB. The second correction loop 101-2 may be configured to perform skew correction by averaging the phases of the clock signals ICLK and ICLKB and the phases of the clock signals QCLK and QCLKB, among the multi-phase clock signals ICLK, QCLK, ICLKB, and QCLKB.

The second correction loop 101-2 may be configured as the first to fourth programmable buffers 131-2, 132-2, 133-2, and 134-2 and the first to fourth signal transfer units 131-1, 132-1, 133-1, and 134-1.

The second correction loop 101-2 may correct a phase skew of a signal in which the phase skew occurred, among the multi-phase clock signals ICLK, QCLK, ICLKB, and QCLKB, by repeatedly performing a loop operation in which a mixing operation and the operations of the first to fourth programmable buffers 131-2, 132-2, 133-2 and 134-2 are combined, the mixing operation indicating an operation of mixing the signal of the first signal path 31 with the third signal path 33, mixing the signal of the second signal path 32 with the fourth signal path 34, mixing the signal of the third signal path 33 with the first signal path 31, and mixing the signal of the fourth signal path 34 with the second signal path 32.

Hereafter, under the assumption that a phase skew occurred in a signal ICLKB_O of the third signal path 33, the phase skew correction operation of the signal ICLKB_O will be described. The signal ICLK_O having a complementary relationship with the signal ICLKB_O may be generated as a signal ICLKB_OOa through the first signal transfer unit 131-1. As the signal ICLKB_O passes through the inverters of the third signal path 33, a signal ICLKB_OOb may be generated. As the signal ICLKB_OOa and the signal ICLKB_OOb are mixed in the same node, a signal ICLKB_OO obtained by averaging the phases of the two signals may be outputted as the phase-corrected clock signal ICLKBC. In this way, the phase of the signal ICLKB_O may be corrected. FIG. 9 only illustrates an example of the phase skew correction process for the clock signals ICLK and ICLKB among the multi-phase clock signals ICLK, QCLK, ICLKB, and QCLKB. The phase skew correction process for the clock signals QCLK and QCLKB may also be performed in the same manner.

Figure 10:
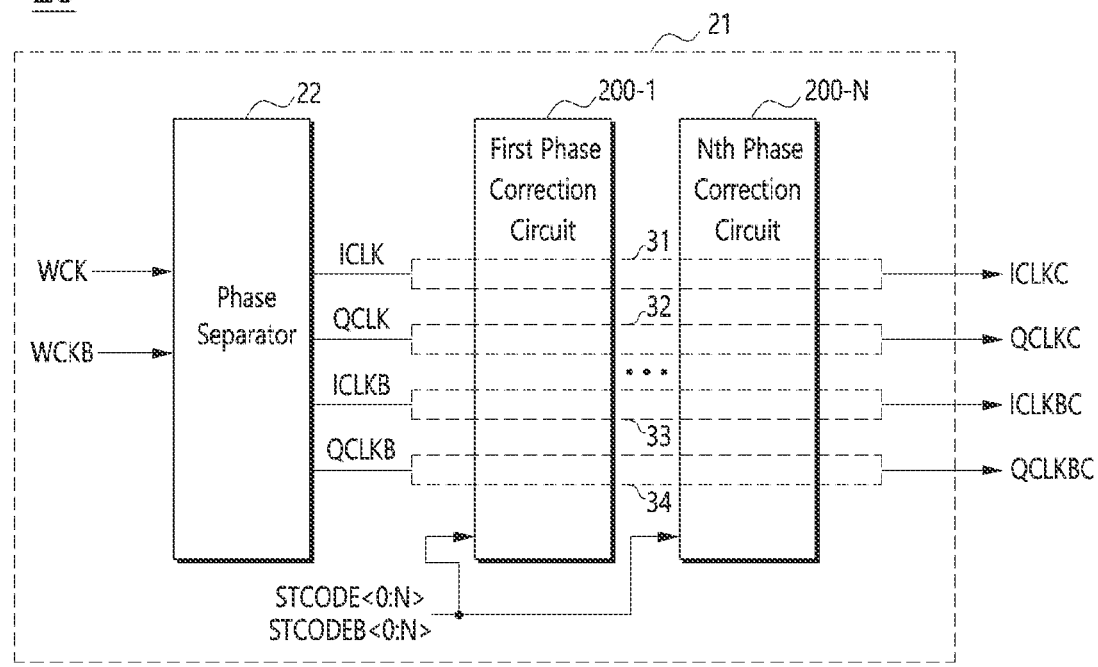
FIG. 10 is a diagram illustrating a configuration of a semiconductor apparatus in accordance with another embodiment.
Figure 10:
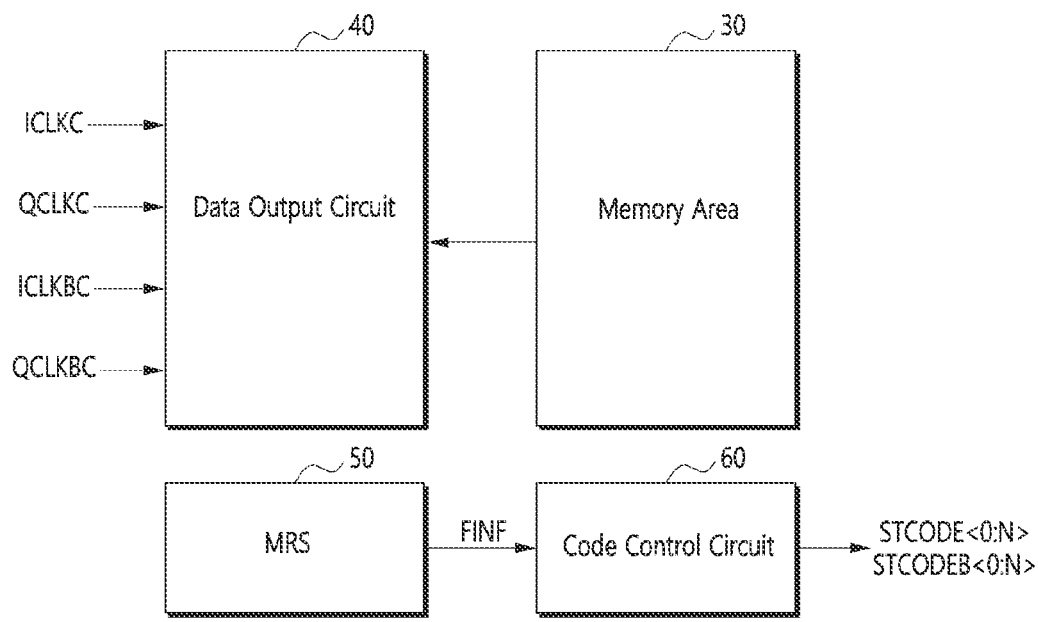

FIG. 10 is a diagram illustrating a configuration of a semiconductor apparatus 20 in accordance with another embodiment.

Referring to FIG. 10, the semiconductor apparatus 20 may include a clock buffer 21, a memory area 30, and a data output circuit 40. The semiconductor apparatus 20 may further include a MRS 50 and a code control circuit 60.

The clock buffer 21 may receive data clock signals WCK and WCKB, and generate multi-phase clock signals ICLK, QCLK, ICLKB, and QCLKB. The clock buffer 21 may be configured to perform a phase correction operation of generating phase-corrected clock signals ICLKC, QCLKC, ICLKBC and QCLKBC by compensating for skew among the multi-phase clock signals ICLK, QCLK, ICLKB, and QCLKB by synthesizing a signal of at least one path among a plurality of signal paths 31 to 34 with another signal path. The clock buffer 21 may be configured to determine whether to perform the phase correction operation according to the operation frequency of the semiconductor apparatus 20. The clock buffer 21 may be configured to change the drivability during the phase correction operation, according to the operation frequency of the semiconductor apparatus 20.

The clock buffer 21 may include a phase separator 22, a plurality of phase correction circuits 200-1 to 200-N, and the plurality of signal paths 31 to 34.

The phase separator 22 may receive the data clock signals WCK and WCKB, and generate the multi-phase clock signals ICLK, QCLK, ICLKB, and QCLKB. The phase separator 22 may separate the phases of the data clock signals WCK and WCKB and simultaneously divide the phases of the data clock signals WCK and WCKB, such that the multi-phase clock signals ICLK, QCLK, ICLKB, and QCLKB each have a frequency divided by 2 or 4, compared to those of the external clock signals WCK and WCKB.

The plurality of phase correction circuits 200-1 to 200-N may each include the plurality of signal paths 31 to 34. The plurality of phase correction circuits 200-1 to 200-N may each perform the phase correction operation of compensating for skew among the multi-phase clock signals ICLK, QCLK, ICLKB, and QCLKB by synthesizing a signal of at least one path among the plurality of signal paths 31 to 34 with another signal path. The plurality of phase correction circuits 200-1 to 200-N may interrupt the phase correction operation in response to drivability control codes STCODE<0:N> and STCODEB<0:N>. The plurality of phase correction circuits 200-1 to 200-N may change the drivability of the phase correction operation in response to the drivability control codes STCODE<0:N> and STCODEB<0:N>. The plurality of phase correction circuits 200-1 to 200-N may be configured in the same manner as the phase correction circuit 100 described with reference to FIGS. 2 to 6.

The memory area 30, the data output circuit 40, the MRS 50, and the code control circuit 60 may be configured in the same manner as FIG. 2.

The clock buffer 21 of the semiconductor apparatus 20 in accordance with the another embodiment may include the plurality of phase correction circuits 200-1 to 200-N coupled to the plurality of signal paths 31 to 34. Therefore, the plurality of phase correction circuits 200-1 to 200-N may repeatedly perform the phase correction operation on outputs of the previous phase correction circuits, which makes it possible to improve the phase correction performance more than the semiconductor apparatus 10 of FIG. 2.

While various embodiments have been described above, it will be understood to those skilled in the art that the embodiments described are examples only. Accordingly, the phase correction circuit, the clock buffer, and the semiconductor apparatus, which are described herein, should not be limited based on the described embodiments.

What is claimed is:

1. A clock buffer comprising:
    a phase separator configured to receive an external clock signal and generate multi-phase clock signals; and
    a phase correction circuit coupled to a plurality of signal paths for transmitting the multi-phase clock signals, the phase correction circuit configured to correct phase skew among the multi-phase clock signals by averaging the phases of two signals which are obtained by synthesizing a signal of each of the signal paths with another signal of a signal path different from the corresponding signal path,
    wherein the phase correction circuit comprises:
    a first correction loop configured to synthesize two adjacent signals based on the plurality of signal paths among the multi-phase clock signals; and
    a second correction loop configured to synthesize complementary signals among the multi-phase clock signals.

2. The clock buffer according to claim 1, wherein the first correction loop comprises a plurality of programmable buffers each having adjustable drivability,
    wherein the plurality of programmable buffers are disabled when an operation frequency is less than a preset value, and each of the plurality of programmable buffers has a drivability that is varied according to the value of the operation frequency when the operation frequency is equal to or greater than the preset value.

3. The clock buffer according to claim 1, wherein the plurality of signal paths comprise a first signal path, a second signal path, a third signal path, and a fourth signal path, wherein the first correction loop comprises:
   a first programmable buffer configured to buffer a signal of a second node of the first signal path, and transfer the buffered signal to a first node of the second signal path;
   a second programmable buffer configured to buffer a signal of a second node of the second signal path, and transfer the buffered signal to a first node of the third signal path;
   a third programmable buffer configured to buffer a signal of a second node of the third signal path, and transfer the buffered signal to a first node of the fourth signal path; and
   a fourth programmable buffer configured to buffer a signal of a second node of the fourth signal path, and transfer the buffered signal to a first node of the first signal path.

4. The clock buffer according to claim 3, wherein the first correction loop further comprises:
   a first signal transfer unit configured to invert a signal of the first node of the first signal path, and transfer the inverted signal to the second node of the third signal path;
   a second signal transfer unit configured to invert a signal of the first node of the second signal path, and transfer the inverted signal to the second node of the fourth signal path;
   a third signal transfer unit configured to invert a signal of the first node of the third signal path, and transfer the inverted signal to the second node of the first signal path; and
   a fourth signal transfer unit configured to invert a signal of the first node of the fourth signal path, and transfer the inverted signal to the second node of the second signal path.

5. A semiconductor apparatus comprising:
   a memory area;
   a data output circuit configured to output data, outputted from the memory area, to outside the semiconductor apparatus according to a phase-corrected clock signal; and
   a clock buffer configured to receive an external clock signal, generate multi-phase clock signals, and generate the phase-corrected clock signal by performing a phase averaging operation on a signal of each of a plurality of signal paths for transmitting the multi-phase clock signals and a signal of another signal path.

6. The semiconductor apparatus according to claim 5, wherein the clock buffer comprises:
   a phase separator configured to receive the external clock signal and generate the multi-phase clock signals; and
   a first correction loop configured to synthesize two adjacent signals based on the plurality of signal paths among the multi-phase clock signals; and
   a second correction loop configured to synthesize complementary signals among the multi-phase clock signals.

7. The semiconductor apparatus according to claim 6, wherein the first correction loop comprises a plurality of programmable buffers each having adjustable drivability,
   wherein the plurality of programmable buffers are disabled when an operation frequency of the semiconductor apparatus is less than a preset value, and each of the plurality of programmable buffers has a drivability that is varied according to the value of the operation frequency when the operation frequency is equal to or greater than the preset value.

8. The semiconductor apparatus according to claim 6, wherein the plurality of signal paths comprise a first signal path, a second signal path, a third signal path, and a fourth signal path,
   wherein the first correction loop comprises:
   a first programmable buffer configured to buffer a signal of a second node of the first signal path, and transfer the buffered signal to a first node of the second signal path;
   a second programmable buffer configured to buffer a signal of a second node of the second signal path, and transfer the buffered signal to a first node of the third signal path;
   a third programmable buffer configured to buffer a signal of a second node of the third signal path, and transfer the buffered signal to a first node of the fourth signal path; and
   a fourth programmable buffer configured to buffer a signal of a second node of the fourth signal path, and transfer the buffered signal to a first node of the first signal path.

9. The semiconductor apparatus according to claim 8, wherein the first correction loop further comprises:
   a first signal transfer unit configured to invert a signal of the first node of the first signal path, and transfer the inverted signal to the second node of the third signal path;
   a second signal transfer unit configured to invert a signal of the first node of the second signal path, and transfer the inverted signal to the second node of the fourth signal path;
   a third signal transfer unit configured to invert a signal of the first node of the third signal path, and transfer the inverted signal to the second node of the first signal path; and
   a fourth signal transfer unit configured to invert a signal of the first node of the fourth signal path, and transfer the inverted signal to the second node of the second signal path.

* * * * *